(12) United States Patent
Hillman

(10) Patent No.: US 8,559,122 B2
(45) Date of Patent: Oct. 15, 2013

(54) INTEGRATED SPIRAL CERTIFICATION HEAD FOR MEDIA MAGNETIC TESTING INCLUDING PMR AND LMR MEDIA

(75) Inventor: Wesley LeRoy Hillman, Morgan Hill, CA (US)

(73) Assignee: HGST Netherlands B.V., Amsterdam (NL)

( * ) Notice: Subject to any disclaimer, the term of this patent is extended or adjusted under 35 U.S.C. 154(b) by 1571 days.

(21) Appl. No.: 11/644,040

(22) Filed: Dec. 22, 2006

(65) Prior Publication Data

US 2008/0151404 A1 Jun. 26, 2008

(51) Int. Cl.
*G11B 27/36* (2006.01)

(52) U.S. Cl.
USPC .............. 360/31; 360/48; 360/53; 360/77.02; 360/125.07

(58) Field of Classification Search
None
See application file for complete search history.

(56) References Cited

U.S. PATENT DOCUMENTS

| | | | |
|---|---|---|---|
| 3,740,736 A | 6/1973 | Dion et al. | |
| 3,781,835 A | 12/1973 | Dion et al. | |
| 3,962,724 A * | 6/1976 | Koizumi | 360/31 |
| 3,984,763 A * | 10/1976 | Koester et al. | 324/212 |
| 4,419,700 A | 12/1983 | Ragle et al. | |
| 4,502,082 A * | 2/1985 | Ragle et al. | 360/76 |
| 5,668,679 A * | 9/1997 | Swearingen et al. | 360/75 |
| 5,691,857 A * | 11/1997 | Fitzpatrick et al. | 360/77.06 |
| 5,798,890 A | 8/1998 | Fontana, Jr. et al. | |
| 5,936,789 A | 8/1999 | Mukohara | |
| 5,998,994 A | 12/1999 | Mori | |
| 6,104,556 A | 8/2000 | Schaenzer | |
| 6,140,815 A * | 10/2000 | Greene et al. | 324/262 |
| 6,166,536 A * | 12/2000 | Chen et al. | 324/212 |
| 6,216,242 B1 | 4/2001 | Schaenzer | |
| 6,304,986 B1 * | 10/2001 | Ma et al. | 714/718 |
| 6,330,122 B1 * | 12/2001 | Chang et al. | 360/31 |
| 6,600,636 B1 * | 7/2003 | Liikanen et al. | 360/317 |
| 6,628,465 B2 | 9/2003 | Yong | |
| 6,631,046 B2 * | 10/2003 | Szita et al. | 360/75 |
| 6,683,744 B2 * | 1/2004 | Takano et al. | 360/78.11 |
| 6,696,831 B2 * | 2/2004 | Nozu | 324/210 |
| 6,826,002 B2 * | 11/2004 | Yanagimoto | 360/25 |
| 6,940,669 B2 * | 9/2005 | Schaenzer et al. | 360/25 |
| 7,131,346 B1 * | 11/2006 | Buttar et al. | 73/865.9 |
| 7,154,699 B2 * | 12/2006 | Subrahamanyan et al. | 360/77.02 |
| 7,161,759 B1 * | 1/2007 | Zhang et al. | 360/75 |

(Continued)

FOREIGN PATENT DOCUMENTS

| | | |
|---|---|---|
| JP | 61-120314 | 6/1986 |
| JP | 4-67402 | 3/1992 |

(Continued)

OTHER PUBLICATIONS

Andresen et al., "Magnetic Recording Media Testing," IBM TDB, Oct. 1983, pp. 2524-2525.

(Continued)

*Primary Examiner* — Dismery Mercedes
(74) *Attorney, Agent, or Firm* — Zilka-Kotab, PC

(57) ABSTRACT

Testing procedure (Integrated Head Spiral Testing) for disk media utilizes a single head with both write and read elements that are offset to allow spiral testing. The offset allows a write element to write one portion of a spiral track while a read element simultaneously reads a previously written portion of the spiral track.

19 Claims, 4 Drawing Sheets

(56) References Cited

U.S. PATENT DOCUMENTS

| | | | |
|---|---|---|---|
| 7,580,218 B2 * | 8/2009 | Shrinkle et al. | 360/77.04 |
| 7,705,588 B2 * | 4/2010 | Eaton et al. | 324/210 |
| 7,706,100 B2 * | 4/2010 | Kawabe | 360/77.04 |
| 2003/0021051 A1 * | 1/2003 | Suzuki et al. | 360/53 |
| 2003/0184899 A1 * | 10/2003 | Gay Sam et al. | 360/25 |
| 2006/0092548 A1 * | 5/2006 | Mihara et al. | 360/75 |
| 2006/0119973 A1 * | 6/2006 | Jamail | 360/75 |
| 2008/0267029 A1 * | 10/2008 | Miles | 369/53.17 |

FOREIGN PATENT DOCUMENTS

| | | |
|---|---|---|
| JP | 4-102267 | 4/1992 |
| JP | 2004/062984 | 2/2004 |
| JP | 2005/018826 | 1/2005 |

OTHER PUBLICATIONS

Jones, "Parallel Servo-Track Write and Read Verification with Side-By-Side Inductive Head Elements," IBM TDB, Jan. 1984, pp. 4243.

* cited by examiner

INTEGRATED SPIRAL CERTIFICATION HEAD FOR MEDIA MAGNETIC TESTING INCLUDING PMR AND LMR MEDIA

BACKGROUND OF THE INVENTION

Media certification testing is performed for all disk drive media and is used to screen the media for defects in the magnetic layers. These defects include scratches, voids from missing media material and other media defects. Testing is generally done on special testers that include a spindle for holding and spinning the disks, head positioners (or actuators) for precisely locating the test head on the disk surface, and computers, controllers and software controlling the tester and interpreting the test results.

Generally, media certification testing is done by writing a track of bit signals with a write head or element and then reading back signal with a read head or element. If there are any defects on the disk the read back signal (output) will be compromised. In industry practice, the testing is done with one of two prior art methods.

The first prior art test procedure is referred to as Spiral Testing. It is performed with two separate or discrete heads as shown in FIG. 1. Specifically, this form of Spiral Testing uses a separate write and a separate read head that are attached to a head gimbal assembly (HGA). The HGA is then connected to separate head positioners (or actuators). These head positioners are generally very accurate positioning devices with servo and/or encoded positioning feedback. However since there is a build up of tolerances associated with using two heads and positioners there is difficulty in maintaining write track to read track alignment. Misregistration of write to read is generally considered being off-track. The alignment or centering of the disk to the spindle also contributes to this off-track problem since if not perfectly centered, the track will be written in an elliptical pattern. The industry practice to eliminate the off-track alignment problems is for the write head to be very wide, for example, 25 microns to 75 microns or more.

Spiral Testing has three primary limitations. First, the wide write test track is not feasible with perpendicular recording technology. The wide write width will not enable proper magnetization of the perpendicular media due to write saturation effects. There are also limitations with the wide write heads for longitudinal recording. Generally these limitations are due to the ability of longitudinal write head technology to properly achieve write saturation on the high coercivity media. If proper write saturation is not achieved the read back signal will be week and the ability to detect defects will be compromised. There are also limitations with the supply and availability of this older write head technology which makes them more scarce and costly. Secondly, Spiral Testing also has difficulties with testers maintaining write to read on track accuracies. If the read head is not properly aligned with the prewritten write track, the readback signal (output) will be compromised and the tester may consider this inaccuracy as a disk defect. Commonly, wide write tracks are used to overcome this difficulty. Thirdly, the tester requires two separate heads and head positioners for performing this test. The two heads are both expensive and lead to misregistration due to the requirement of aligning two separate heads.

The second prior art test procedure is referred to as Step and Repeat Testing as shown in FIG. 2. Step and Repeat Testing employs a single head with integrated write and read elements. In Step and Repeat Testing each track 201 is tested by being written and read before moving the head to another track to test. The Step and Repeat Testing method has the advantage of eliminating the tolerance problem with two separate heads and head positioners and elliptical write track patterns. Furthermore, this testing method allows the write element structure to have a narrower write track to better enable proper write saturation. Lastly, there does not need to be two separate heads and scanners. This is because the same head writes and reads the test data and includes both a read and a write element.

However, the Step and Repeat Testing method has a disadvantage versus Spiral Testing in testing time and throughput. Step and Repeat Testing requires time to write one track and then read that same track during the next revolution. After reading, the head positioner needs to move the head to another track, which requires additional time to move and settle. Then this write-read-move cycle is repeated. Thus, Step and Repeat Testing is between two to three times longer than Spiral Testing. This additional time has a big impact to media manufactures due to the additional testers and space required to overcome the slowness of the method.

What is needed is an effective testing procedure that is both fast and efficient.

SUMMARY OF THE INVENTION

Described is a procedure, Integrated Head Spiral Testing. Integrated Head Spiral Testing utilizes a single head with both a write and a read element that are offset. This head structure and the procedure allows for the benefits of both Spiral Testing and Step and Repeat Testing without many of the drawbacks. The procedure utilizes a single integrated head that includes a write element offset from a read element. The read and write elements can be offset by a predetermined amount that is also matched to the head positioner movement per revolution. One example of such a matching is the head positioner moving the head 15 microns for every disk revolution which would be equal to the offset of the write and read elements. The procedure includes the write element continuously writing while the scanner moves at a constant travel rate of 15 microns per revolution. The net result will be a write track written in a spiral. After one or more revolutions the read head will continuously read the prewritten track and will follow the write head in the same spiral pattern. This spiral track is written and read in a manner similar to a record needle following a grove in a record.

The method eliminates the tolerance problems of using two separate heads and scanners. Further, the write element can be made small enough to overcome the write saturation problems. In addition, Integrated Head Spiral Testing drastically improves throughput over the Step and Repeat method.

DETAILED DESCRIPTION OF THE INVENTION

The following description is of the best embodiments presently contemplated for carrying out this invention. This description is made for the purpose of illustrating the general principles of this invention and is not meant to limit the inventive concepts claimed herein.

Figure 1:
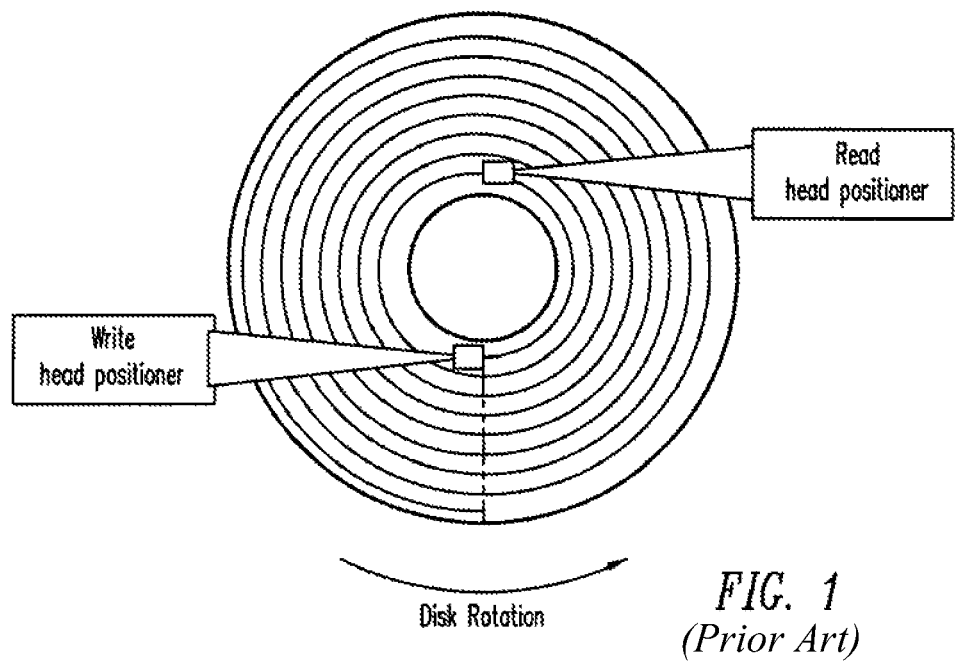
FIG. 1 is a figure describing (prior art) Spiral Testing.
Figure 2:
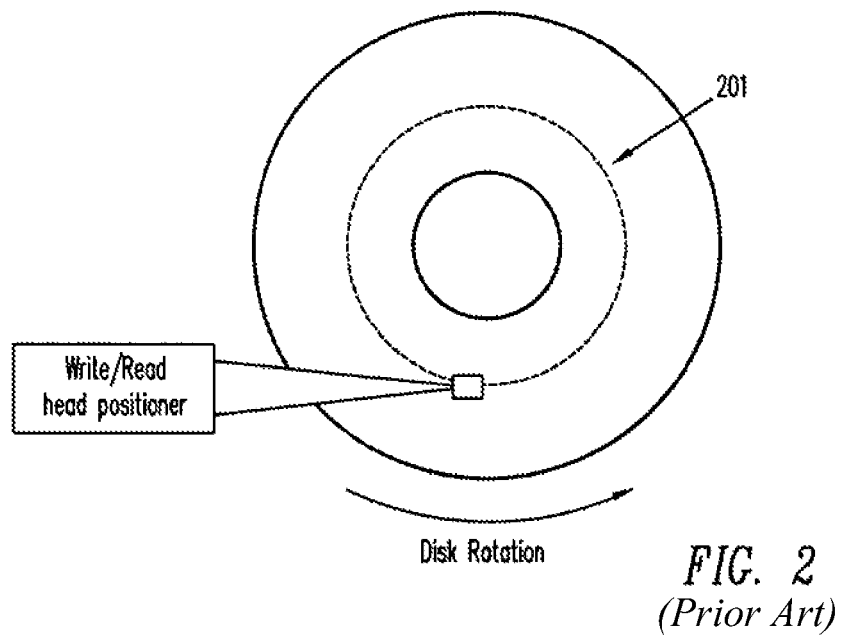
FIG. 2 is a figure describing (prior art) Step and Repeat Testing.
Figure 3A:
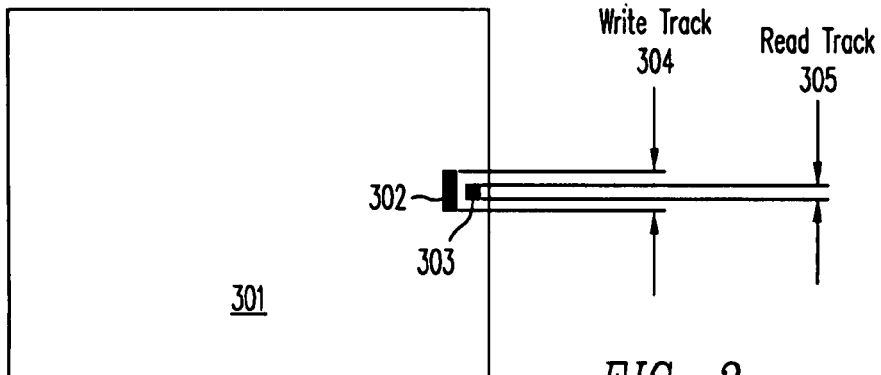
FIG. 3a is a figure of a head to be used with prior art methods.

FIG. 3a shows a head 301 consistent with the prior art. The head includes a write element 302 and a read element 303. The write element 302 writes a write track 304. The read element 303 reads a read track 305. As can be seen from FIG. 3a, read track 305 is encompassed by write track 304 due to the positioning and size of read element 303 and write element 302. Further, both write element 302 and read element 303 generally have the same track center line.

Figure 3B:
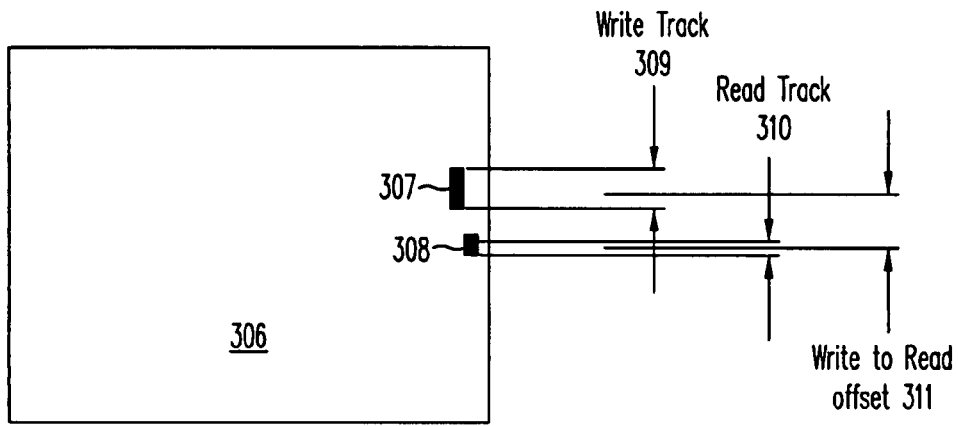
FIG. 3b is a figure of a head to be used with Integrated Head Spiral Testing.

FIG. 3b shows an Integrated Head Spiral Testing head 306 including a write element 307 which is offset from a read element 308 to be used with Integrated Head Spiral Testing. The write and read elements read offset write track 309 and read track 310 respectively. The offset between the write track 309 and the read track 310 is the write to read offset 311. The write to read offset may determine the spiral scan/positioner scan rate of the Integrated Head Spiral Testing method described below. The offset is generally a predetermined amount, such as 15 microns. The offset can be by the same distance as determined by the spiral scan rate (microns per revolution) divided by an integer. The write and read element offset can be arranged using common head fabrication process using photolithography masks to offset the alignments between the write and read element structures.

Figure 5:
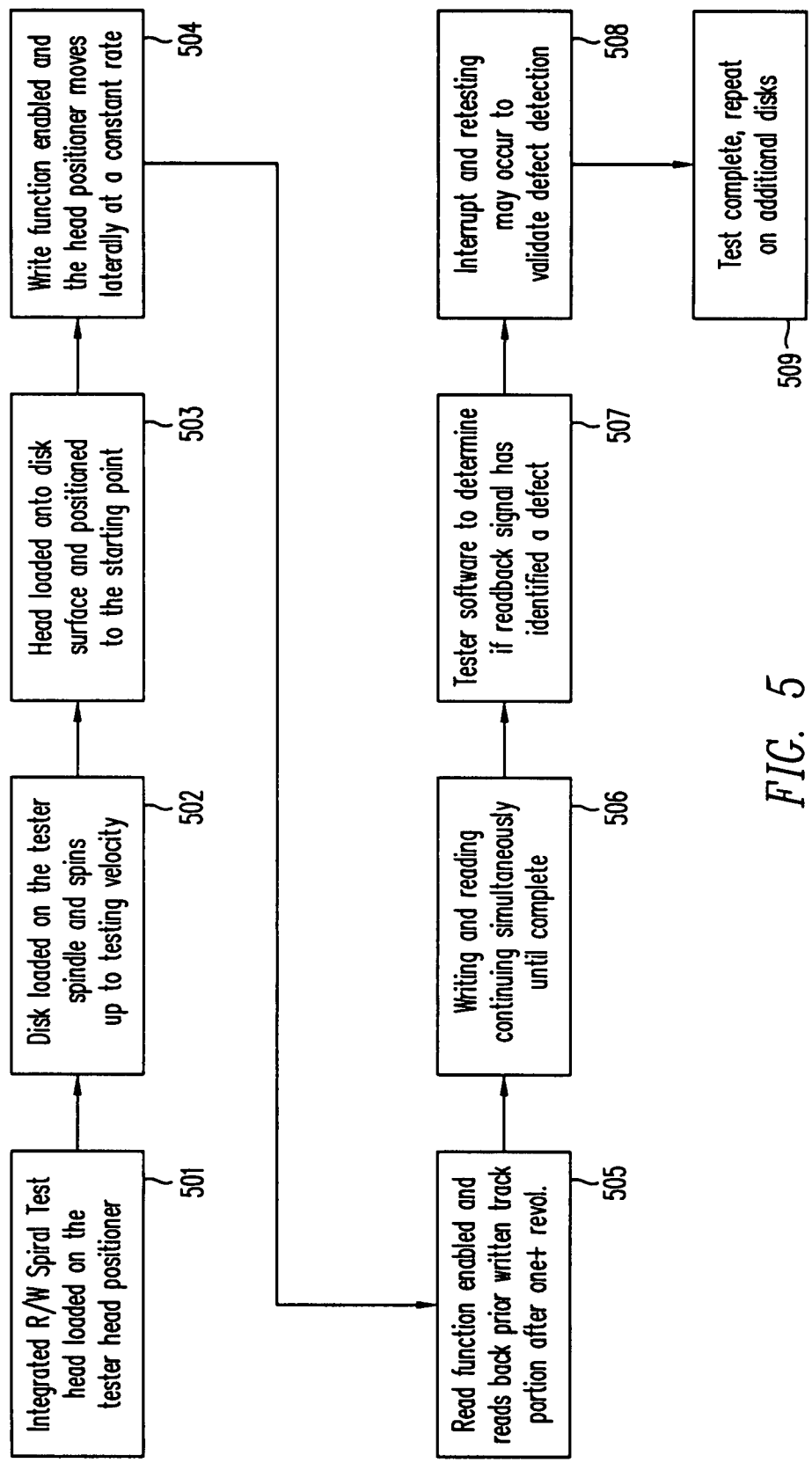
FIG. 5 is a flow chart for Integrated Head Spiral Testing.

The integrated head 306 is mounted on a head gimbal assembly to suspend and electrically connect the head to tester mounting surfaces and electronics. An Integrated Head Spiral Testing method, as shown in FIG. 5, to test a disk media is described below. The test can be implemented with head 306. The Integrated Head Spiral Testing head 306 is loaded on the tester head positioner 501. A disk is loaded on the tester spindle and the tester spindle spins up to testing velocity 502. The head 306 is then loaded over a disk surface and positioned over the starting point of the disk 503. A write function is enabled and the head positioner moves laterally at a constant rate 504. The write function is enabled to write test data on a continuous spiral track, for example, from the OD of the disk to the ID of the disk. This spiral track pitch is created by the continuous lateral movement of the head positioner (for example 15 microns lateral movement per disk revolution). This head positioning movement in relationship to the disk rotation velocity will be controlled by the tester controller and software. The spiral write track is written so that the head is capable of writing a part of the track at the same time it reads earlier portion of the track.

A read function is then enabled and reads back a prior written portion of the spiral track after at least one revolution 505. Writing and reading to and from the disk by the head 306 continues simultaneously until the testing of the disk is complete 506. Tester software then determines if the readback signal has shown a suspected defect 507 by looking to see if the data written to the disk matched the corresponding data read from the disk or if the readback signal is diminished. If a suspected defect has been identified, the testing cycle can be interrupted and the defect site can be retested to validate that a defect has been found 508. Otherwise the disk passes the test. Once the testing is complete, tests may be performed on additional disks 509.

Figure 4A:
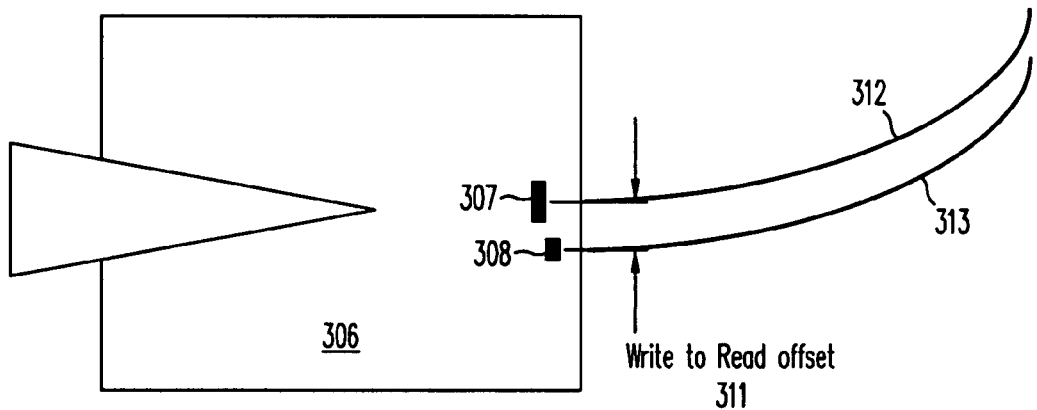
FIG. 4a is a figure demonstrating Integrated Head Spiral Testing.
Figure 4B:
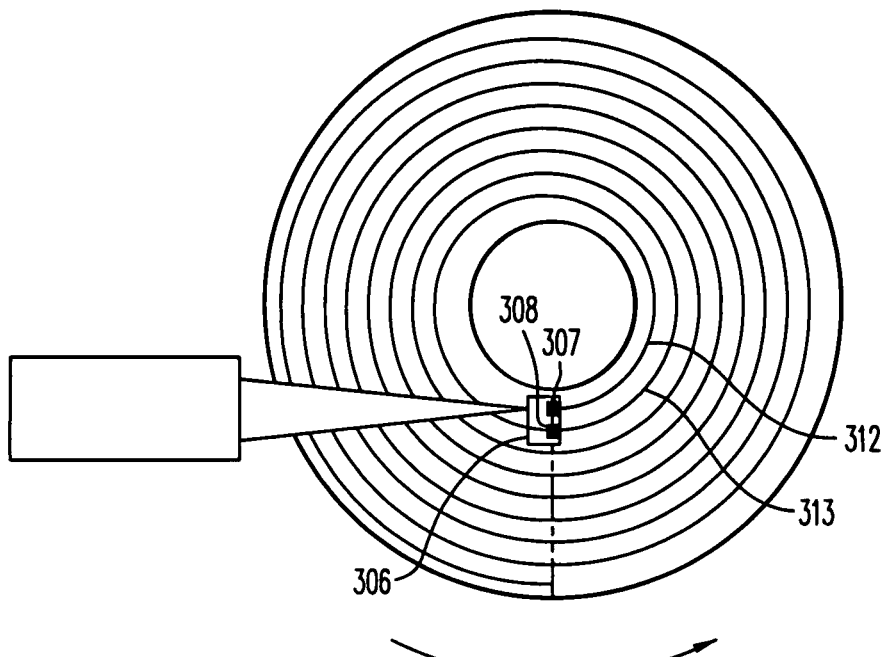
FIG. 4b is a second figure demonstrating Integrated Head Spiral Testing.
Figure 4C:
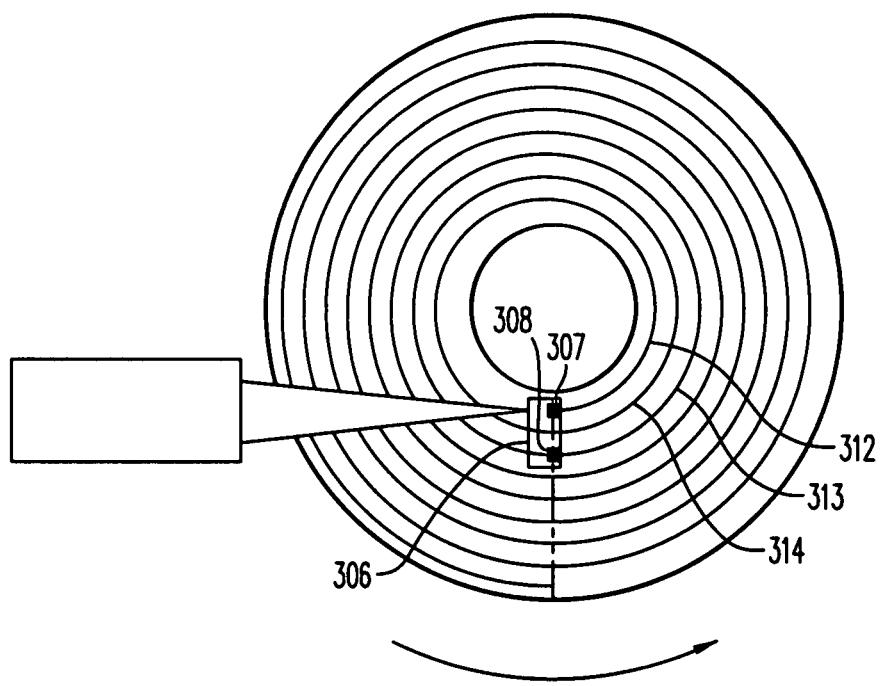
FIG. 4c is a third figure demonstrating Integrated Head Spiral Testing with a portion of the spiral track between the portion of the spiral track being written and the portion of the spiral track being read.

FIG. 4a demonstrates pictorially a portion of a method described herein. The head 306 with write element 307 and read element 308 is positioned so that it can write the portion of the spiral track 312 while simultaneously reading an earlier written portion of the spiral track 313. Portion of spiral track 312 is offset from portion of spiral track 313 by the write read offset 311. Further, the method can be implemented to have any number of portions of the spiral track between portions of the spiral track 312 and 313 so long as the write and read elements 307 and 308 are positioned over the portions 312 and 313. FIG. 4b is a full disk view of the method described herein. FIG. 4c is a second full disk view of the method described herein. This figure has a portion of the spiral track 314 between the currently written portion of the spiral track 312 and the currently read portion of the spiral track 313. The lateral movement of the head positioner in the case of FIG. 4c would be one half the read write offset per disk revolution.

Testers that have already been equipped with two positioners as stated in the first prior art descriptions can be retrofitted with two Integrated Head Spiral Testing heads on each positioner. Each head can be assigned to different radii on the disk to test. This essentially doubles the throughput of a Spiral Testing tester. In addition each of the Integrated Head Spiral Testing can write an interleaved and non-intersecting spiral on the disk.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A system for testing media including:
    a spin stand;
    a head including a read element and a write element offset by an offset amount, wherein the system is designed to use the head to concurrently:
        write a spiral data track to a disk; and
        read a portion of the spiral data track that was written to the disk one or more revolutions prior to a portion of the spiral data track currently being written to produce a readback signal; and
    logic adapted for determining when the readback signal shows a suspected defect,
        wherein the offset is in a cross track direction relative to the spiral data track, and
        wherein the offset amount equals a distance, or integer multiple of the distance, that the head moves per one revolution of the spin stand.

2. The system of claim 1, wherein a positioner of the head is configured to move the head laterally along the disk in a straight line when concurrently writing and reading the spiral data track.

3. The system of claim 1, comprising logic adapted for re-reading the previously written portion of the spiral data track that produced the suspected defect again to validate the suspected defect.

4. The system of claim 3, further comprising logic adapted for interrupting the concurrent reading and writing in order to re-read the previously written portion that produced the suspected defect immediately upon determining that the readback signal shows the suspected defect.

5. The system of claim 1, wherein the head is attached to a read/write positioner attached to the spin stand configured to move the head to write the spiral data track.

6. The system of claim 1, wherein a pitch of immediately adjacent portions of the spiral data track lying along a common radial line is consistent along the disk.

7. The system of claim 1, wherein the head is designed to be used with perpendicular media.

8. The system of claim 1, further comprising:
a second head, including a second read element and a second write element offset by a second offset amount, wherein the system is designed to use the second head to concurrently:
write a second spiral data track; and
read a portion of the second spiral data track that was written to the disk one or more revolutions prior to a portion of the second spiral data track currently being written to produce a second readback signal; and
logic adapted for determining when the second readback signal shows a suspected defect,
wherein the second offset is in the cross track direction relative to the second spiral data track, and
wherein the second offset amount equals the distance, or integer multiple of the distance, that the head moves per one revolution of the spin stand.

9. The system of claim 1, wherein the logic adapted for determining when the readback shows the suspected defect comprises determining that the readback signal is diminished relative to the readback signal obtained in other areas of the spiral data track.

10. The system of claim 9, wherein the spiral data track is interleaved and non-intersecting with the second spiral data track.

11. The system of claim 1, including a second head including a read element and a write element offset by a second offset amount, wherein the system is designed to use the second head to write a second spiral data track and read a previously written portion of the second spiral data track.

12. A method for determining the existence of a disk defect including the steps of: loading a first disk on a tester; positioning a head over a starting point of the first disk; enabling a write function of the head concurrently with enabling a read function of the head; moving the head positioner laterally at a constant rate to write data on a spiral data track; reading a previously written portion of the spiral data track that was written to the first disk one or more revolutions prior to a portion of the spiral data track currently being written to produce a readback; and comparing the read previously written portion of the spiral data track and corresponding written data on the spiral data track to determine if there is a defect on the first disk; wherein the head includes an offset read element and write element, the offset being in a cross track direction relative to the spiral data track, and wherein an amount of the offset equals a distance, or integer multiple of the distance, that the head moves per one revolution of the tester.

13. The method of claim 12, wherein the comparing step is performed by software.

14. The method of claim 12, including the step of interrupting the test procedure and retesting a defect site if the comparing step shows that a defect is found.

15. The method of claim 12, further comprising loading a second disk onto the tester after completion of a test on the first disk.

16. The method of claim 12, wherein the media is perpendicular media.

17. The method of claim 12, further comprising interrupting the concurrent reading and writing in order to re-read the previously written portion that produced the defect immediately upon determining that the first disk has the defect.

18. The method of claim 12, wherein the comparing step includes determining if the readback signal from the previously written portion of the spiral data track is diminished.

19. A system for testing media including: a spin stand; and a first head and a second head attached to the spin stand, the first head and the second head both include a read element and a write element offset by an offset amount, the offset being in a cross track direction relative to the spiral data track, wherein an amount of the offset equals a distance, or integer multiple of the distance, that the head moves per one revolution of the tester; and wherein the system is designed to use both the first head and the second head to write a spiral data track to a disk and read a previously written portion of the spiral data track not on the current revolution of the spiral data track from the disk to produce a readback signal for use in determining if there is a defect in the disk.

* * * * *